United States Patent
Li et al.

(10) Patent No.: US 10,192,826 B2
(45) Date of Patent: Jan. 29, 2019

(54) CONDUCTIVE LAYOUT STRUCTURE INCLUDING HIGH RESISTIVE LAYER

(71) Applicant: UNITED MICROELECTRONICS CORP., Hsin-Chu (TW)

(72) Inventors: Kun-Ju Li, Tainan (TW); Kuo-Chin Hung, Changhua County (TW); Min-Chuan Tsai, New Taipei (TW); Wei-Chuan Tsai, Changhua County (TW); Yi-Han Liao, Taichung (TW); Chun-Tsen Lu, Tainan (TW); Fu-Shou Tsai, Keelung (TW); Li-Chieh Hsu, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/853,978

(22) Filed: Dec. 26, 2017

(65) Prior Publication Data
US 2018/0138125 A1 May 17, 2018

Related U.S. Application Data

(62) Division of application No. 15/340,982, filed on Nov. 2, 2016, now Pat. No. 9,887,158.

(30) Foreign Application Priority Data

Oct. 4, 2016 (TW) .............................. 105132044 A

(51) Int. Cl.
| | | |
|---|---|---|
| *H01L 23/52* | (2006.01) | |
| *H01L 29/41* | (2006.01) | |
| *H01L 23/528* | (2006.01) | |
| *H01L 23/532* | (2006.01) | |
| *H01L 23/485* | (2006.01) | |
| *H01L 21/768* | (2006.01) | |
| *H01L 23/522* | (2006.01) | |
(Continued)

(52) U.S. Cl.
CPC .... *H01L 23/5283* (2013.01); *H01L 21/76843* (2013.01); *H01L 21/76846* (2013.01); *H01L 21/76883* (2013.01); *H01L 23/485* (2013.01); *H01L 23/5228* (2013.01); *H01L 23/53238* (2013.01); *H01L 23/53266* (2013.01); *H01L 29/41758* (2013.01); *H01L 29/66628* (2013.01); *H01L 29/7833* (2013.01)

(58) Field of Classification Search
CPC ............. H01L 23/5283; H01L 23/5228; H01L 23/53266; H01L 29/41758
See application file for complete search history.

(56) References Cited

U.S. PATENT DOCUMENTS

| | | |
|---|---|---|
| 5,936,257 A | 8/1999 | Kusunoki |
| 6,229,211 B1 | 5/2001 | Kawanoue |

(Continued)

FOREIGN PATENT DOCUMENTS

TW    10090396 B2 * 10/2018  ......... H01L 29/4958

*Primary Examiner* — Ida M Soward
(74) *Attorney, Agent, or Firm* — Winston Hsu

(57) ABSTRACT

A layout structure including a conductive structure is provided. The layout structure includes a dielectric layer formed on a substrate and a conductive structure formed in the dielectric layer. And the conductive structure further includes a barrier layer, a metal layer formed within the barrier layer, and a high resistive layer sandwiched in between the barrier layer and the metal layer.

8 Claims, 9 Drawing Sheets

A-A'

(51) Int. Cl.
*H01L 29/417* (2006.01)
*H01L 29/66* (2006.01)
*H01L 29/78* (2006.01)

(56) References Cited

U.S. PATENT DOCUMENTS

| | | | |
|---|---|---|---|
| 6,509,257 B1 | 1/2003 | Chen | |
| 6,602,782 B2 | 8/2003 | Lee | |
| 6,670,266 B2* | 12/2003 | Nguyen | H01L 21/76846 |
| | | | 257/E21.592 |
| 6,723,612 B2* | 4/2004 | Iijima | H01L 28/60 |
| | | | 257/310 |
| 6,905,960 B2* | 6/2005 | Park | H01L 21/76843 |
| | | | 257/E21.585 |
| 6,984,591 B1 | 1/2006 | Buchanan | |
| 8,105,937 B2 | 1/2012 | Cheng | |
| 8,524,600 B2* | 9/2013 | Lei | H01L 21/76885 |
| | | | 257/E21.159 |
| 8,692,224 B2 | 4/2014 | Lin | |
| 9,040,953 B2 | 5/2015 | Arayashiki | |
| 9,169,556 B2 | 10/2015 | Wu et al. | |
| 9,276,205 B2* | 3/2016 | Arayashiki | H01L 45/145 |
| 9,331,179 B2* | 5/2016 | Liu | H01L 21/28008 |
| 9,406,757 B2* | 8/2016 | Nakano | H01L 29/1608 |
| 9,837,350 B2* | 12/2017 | Briggs | H01L 23/5226 |
| 9,899,264 B2* | 2/2018 | Bao | H01L 21/82345 |
| 2002/0064941 A1 | 5/2002 | Chooi | |
| 2002/0115287 A1 | 8/2002 | Hashim | |
| 2007/0241458 A1 | 10/2007 | Ding | |
| 2009/0155997 A1* | 6/2009 | Shinriki | C23C 16/045 |
| | | | 438/653 |
| 2009/0163025 A1 | 6/2009 | Humayun | |
| 2010/0159694 A1 | 6/2010 | Chandrashekar | |
| 2012/0040530 A1 | 2/2012 | Humayun | |
| 2012/0231626 A1 | 9/2012 | Lee | |
| 2015/0041854 A1* | 2/2015 | Wang | H01L 29/0653 |
| | | | 257/190 |
| 2015/0084137 A1 | 3/2015 | Hsieh et al. | |
| 2017/0069757 A1* | 3/2017 | Peng | H01L 29/66795 |
| 2017/0278969 A1* | 9/2017 | Adusumilli | H01L 29/4966 |

* cited by examiner

CONDUCTIVE LAYOUT STRUCTURE INCLUDING HIGH RESISTIVE LAYER

CROSS REFERENCE TO RELATED APPLICATIONS

This application is a division of U.S. patent application Ser. No. 15/340,982 filed on Nov. 2, 2016, and incorporated herein by reference in its entirety.

BACKGROUND OF THE INVENTION

1. Field of the Invention

The present invention relates to a conductive structure, a layout structure including conductive structure, and a method for manufacturing conductive structure, and more particularly, to a method including planarization process and the conductive structure and the layout structure formed by the method.

2. Description of the Prior Art

The semiconductor integrated circuit (IC) industry has experienced rapid growth. And new microfabrication techniques are being developed with the realization of higher integration degrees and higher operation speeds. Chemical-mechanical polishing (hereinafter abbreviated as CMP) method is one such technique that is applied to planarization of interlayer insulating films, formation of contact plugs, and formation of embedded wiring in IC manufacturing process.

Typically, excess portions other than required metal or insulating material are removed by CMP and thus an even surface is obtained for subsequent processes. For example, in the interconnection fabrication process, series of trenches, openings, or vias are formed in an insulating material on a substrate and filled up with a conductive layer. And excess portions of the conductive layer are removed by the CMP. Consequently, wirings and/or via structures are formed in the insulating material. Those skilled in the art also know that CMP is also involved in planarization of shallow trench isolation region.

It is found that when removing the metal materials by the planarization, the unwanted short circuit may be formed between individual devices because of remnant metals left by the insufficient planarization. Furthermore, dishing defect, which is the formation of topographical defects, such as concavities or depressions, in the metal and metal alloy layer of features formed on the substrate surface, is often found. Dishing defect further results in a non-planar surface that impairs the ability to print high resolution lines during subsequent photolithographic steps and detrimentally affects subsequent surface topography of the substrate and device/line formation. Furthermore, dishing defect also detrimentally affects the performance of devices by lowering the conductance and increasing the resistance of the devices. Therefore, a method that is able to prevent aforementioned insufficient planarization and dishing defect is still in need.

SUMMARY OF THE INVENTION

According to the claimed invention, a conductive structure is provided. The conductive structure includes a substrate including a first dielectric layer formed thereon, a first trench formed in the first dielectric layer, a first barrier layer formed in the first trench, a first nucleation layer formed on the first barrier layer, a first metal layer formed on the first nucleation layer, and a first high resistive layer sandwiched in between the first barrier layer and first metal layer.

According to the claimed invention, a layout structure including a conductive structure is provided. The layout structure includes a dielectric layer formed on a substrate and a conductive structure formed in the dielectric layer. And the conductive structure further includes a barrier layer, a metal layer formed within the barrier layer, and a high resistive layer sandwiched in between the barrier layer and the metal layer.

According to the claimed invention, a method for manufacturing a conductive structure is provided. The method includes following steps. A substrate including a dielectric layer formed thereon is provided, and at least a trench is formed in the dielectric layer. A barrier layer is then formed in the trench and on the dielectric layer and followed by forming a first nucleation layer on the barrier layer. Next, a surface treatment is performed to a surface of the first nucleation layer to form a high resistive layer on the surface of the first nucleation layer. Subsequently, the trench is filled up with a metal layer and followed by performing a planarization process to remove portions of the metal layer to expose the high resistive layer.

According to the method for manufacturing the conductive structure provided by the present invention, the high resistive layer is formed on the surface of the nucleation layer by performing the surface treatment, and the high resistive layer is to protect the underneath layer(s) such as the nucleation layer and the barrier layer during planarization process. Consequently, dishing defect is avoided. Accordingly, the conductive structure and the layout structure including the conductive structure obtained by the method include the high resistive layer sandwiched in between the metal layer and the nucleation layer. Furthermore, in the layout structure including the conductive structure, the high resistive layer, the nucleation layer and the barrier layer include a concentric pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a method for manufacturing a conductive structure provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 5 is a cross-sectional view taken along a Line A-A' of FIG. 6.

FIGS. 7-9 are schematic drawings illustrating a method for manufacturing a conductive structure provided by a second preferred embodiment of the present invention, wherein FIG. 8 is a schematic drawing in a step subsequent to FIG. 7, and FIG. 9 is a schematic drawing in a step subsequent to FIG. 8.

FIG. 9 is a cross-sectional view taken along a Line B-B' of FIG. 10.

FIGS. 13-14 are schematic drawings illustrating a conductive structure provided by still another preferred embodiment of the present invention, wherein FIG. 14 is a schematic drawing in a step subsequent to FIG. 13.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
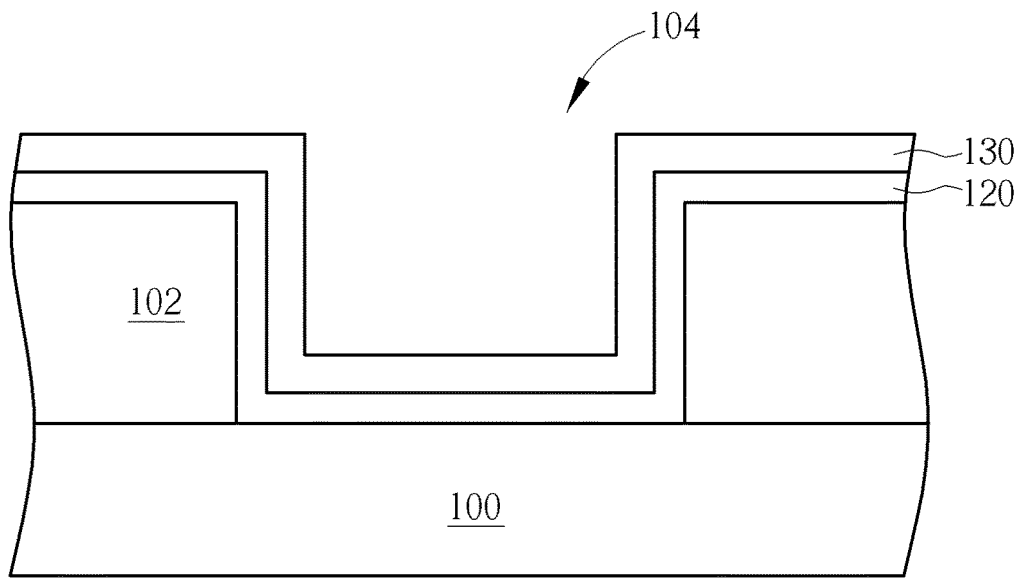

Please refer to FIGS. 1-5, which are schematic drawings illustrating a method for manufacturing a conductive structure provided by a first preferred embodiment of the present invention. As shown in FIG. 1, the method for manufacturing the conductive structure provided by the preferred embodiment first provides a substrate 100, and the substrate 100 can include a semiconductor material, such as silicon (Si), germanium (Ge), III-V compound, or II-VI compound. In some embodiments of the present invention, the substrate 100 can be a bulk silicon substrate. In other embodiments of the present invention, the substrate 100 can be a semiconductor on insulator (SOI) substrate. An active circuit (not shown) is disposed in the substrate 100. It should be easily understood by those skilled in the art that the active circuit may include a plurality of metal-oxide-semiconductor (MOS) transistor devices (not shown) or other devices. And a plurality of shallow trench isolations (hereinafter abbreviated as STIs) (not shown) can be formed to isolate those devices.

Please refer to FIG. 1 again. A dielectric layer 102 is formed on the substrate 100. In some embodiments of the present invention, the dielectric layer 102 can include an interlayer-dielectric (hereinafter abbreviated as ILD) layer. In other embodiments of the present invention, the dielectric layer 102 can be an inter-metal dielectric (hereinafter abbreviated as IMD) layer. The dielectric layer 102 used to provide electrical isolation can include boro-phospho-silicate glass (BPSG), phosphor-silicate glass (PSG), tetra-ethyl-ortho-silicate (TEOS), low-k dielectric material such as black Diamond® available from Applied Materials, Inc. of Santa Clara, Calif., fluorinated silica glass (FSG), porous low-k dielectric material, or self-assembled dielectric material, but not limited to this.

Please still refer to FIG. 1. At least a trench 104 is formed in the dielectric layer 102. Next, a barrier layer 120 is formed in the trench 104 and on the substrate 100, and followed by forming a nucleation layer 130 on the barrier layer 120. In the preferred embodiment, the barrier layer 120 can include a titanium nitride (hereinafter abbreviated as TiN) layer, but not limited to this. It is well-known to those skilled in the art that the nucleation layer is a thin metal layer conformally deposited by atomic layer deposition (ALD) and serves as a base to form a thicker metal layer including the same metal. For example, when a tungsten (W) layer is to be formed, the nucleation layer 130 can be a thin tungsten layer. And when a copper layer is to be formed, the nucleation layer 130 can be a thin copper layer. Additionally, a thickness of the nucleation layer 130 can be 70 angstroms (Å), but not limited to this.

Figure 2:
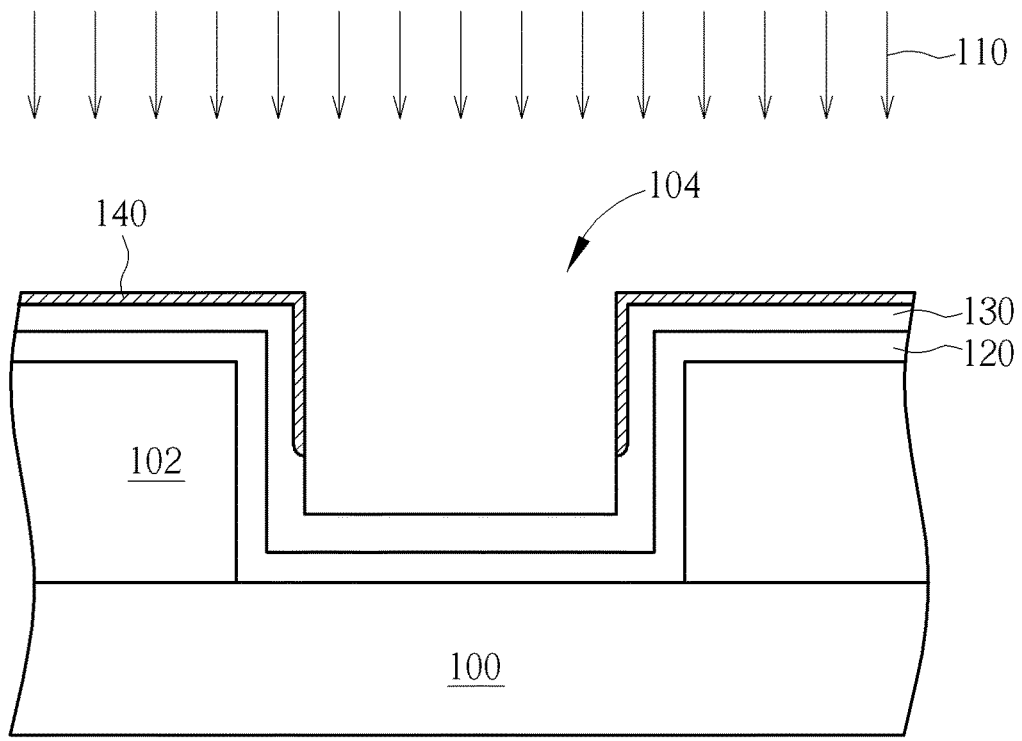

Please refer to FIG. 2. After forming the nucleation layer 130, a surface treatment 110 is performed to a surface of the nucleation layer 130. Consequently, a high resistive layer 140 is formed on the surface of the nucleation layer 130. A thickness of the high resistive layer 140 can be 1%-10% of the thickness of the nucleation layer 130, but not limited to this. In the preferred embodiment, the surface treatment 110 includes introducing nitrogen, oxygen, or carbon, but not limited to this. The nitrogen can be delivered through various nitrogen-containing precursors, such as $N_2$, $NH_3$, $H_2$, Ar, He, Ne or other similar gases and combinations of gases. Consequently, nitridation occurs on the surface of the nucleation layer 130 and thus the high resistive layer 140 is formed. In the same concept, oxygen can be delivered through introducing oxygen gas, and carbon can be delivered through various carbon-containing precursors. Consequently, oxidation or carbonization occurs on the surface of the nucleation layer 130 and thus the high resistive layer 140 is formed. It is noteworthy that the nitridation, oxidation or carbonization occurs on the surface of the nucleation layer 130, and more particularly, on a portion of the surface of the nucleation layer 130. In detail, the nitridation, oxidation or carbonization occurs on the portion of the surface above an opening of the trench 104. Specifically, a reaction rate on the surface above the opening of the trench 104 is much larger than a reaction rate on a surface of the nucleation layer 130 within the trench 104. Therefore, by adjusting parameters of the surface treatment 110, the nitridation, oxidation or carbonization can be stopped when the high resistive layer 140 is formed on the surface of the nucleation layer 130 above or around the opening of the trench 104. In other words, in some embodiments of the present invention, the nucleation layer 130 preferably is still exposed at a bottom of the trench 104 as shown in FIG. 2. It is noteworthy that since the high resistive layer 140 is formed by nitridation, oxidation, or carbonization of at least the portion of the surface of the nucleation layer 130, which includes a metal material the same with a metal layer formed thereon, the high resistive layer 140 includes a metal nitride, a metal oxide, or metal carbide of the metal material of the nucleation layer 130. For example, when the metal layer to be formed includes tungsten, the high resistive layer 140 includes tungsten nitride (WN), tungsten oxide (WO), or tungsten carbide (WC).

Figure 3:
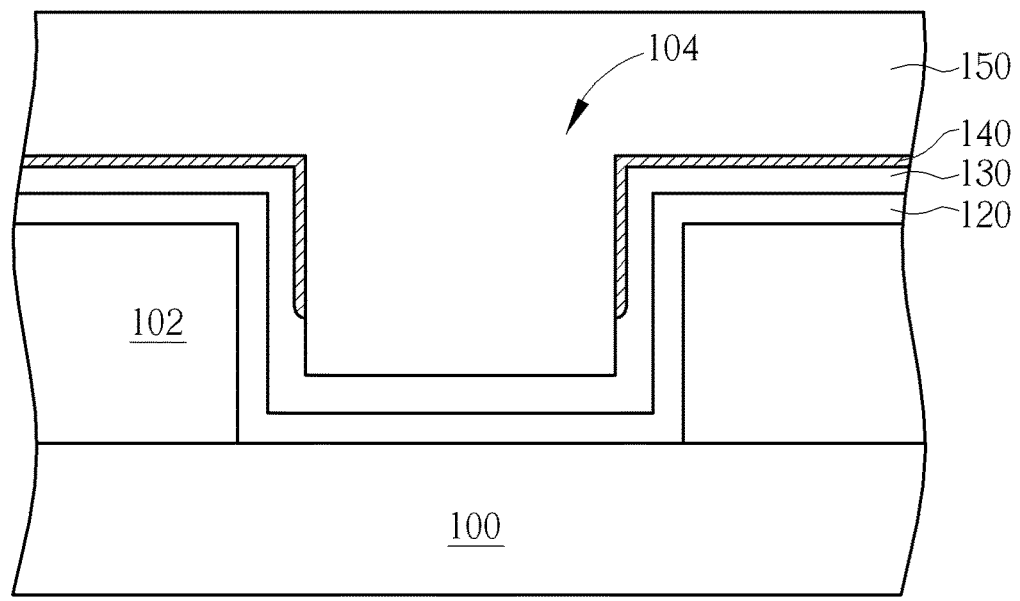

Please refer to FIG. 3. After forming the high resistive layer 140, a metal layer 150 is formed on the substrate 100 to fill up the trench 104. It is noteworthy that the metal layer 150 is nucleated and formed from a surface of the nucleation layer 130, however nucleation can be slowed down on the surface of the high resistive layer 140 due to the metal nitride, metal oxide or metal carbide. Consequently, the metal layer 150 is upwardly formed from the nucleation layer 130 exposed at the bottom of the trench 104. More important, since the metal layer 150 is formed upwardly instead of inwardly, seams that often found within the inwardly formed metal layer are avoided according to the preferred embodiment. Additionally, the metal layer 150 includes a metal material the same with the nucleation layer 130 that is tungsten in the preferred embodiment, but not limited to this.

Figure 4:
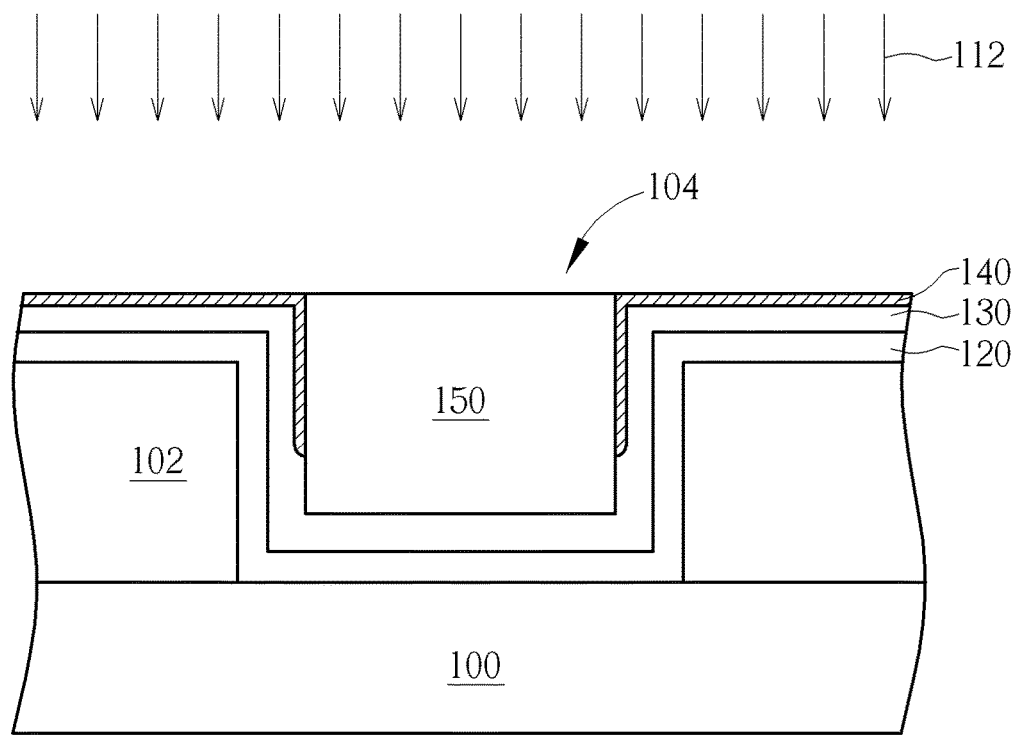

Please refer to FIG. 4. After forming the metal layer 150, a planarization process 112 such as a CMP process is performed to remove a portion of the metal layer 150 to expose the high resistive layer 140. It is noteworthy that in the conventional planarization process, a magnetic field penetrating the substrate is introduced and thus Eddy currents are created by the barrier layer 120 in the substrate. Typically, whether the removal of the barrier layer is completed can be recognized by detecting the eddy currents rate: When no eddy currents are detected, it means the barrier layer is removed from the surface of the dielectric layer. Accordingly, it is also recognized that the dielectric layer is exposed and thus the planarization process is terminated. According to the present invention, the high resistive layer 140 is formed to shield the barrier layer 120, and thus no eddy current will be created or detected in the planarization process 112. And the planarization process 112 is terminated by adjusting parameters such as duration of the planarization process 112. In other words, the high resistive layer 140 and the nucleation layer 130 serve as a protecting layer for the barrier layer 120, as shown in FIG. 4. In other embodiments of the present invention, since the high resistive layer 140 is to shield the barrier layer 120, removal of the high resistive layer 140 can be recognized once eddy currents are detected. Accordingly, the planarization process 112 is terminated, and at least the nucleation layer 130 still serves as a protecting layer for the barrier layer 120.

Figure 5:
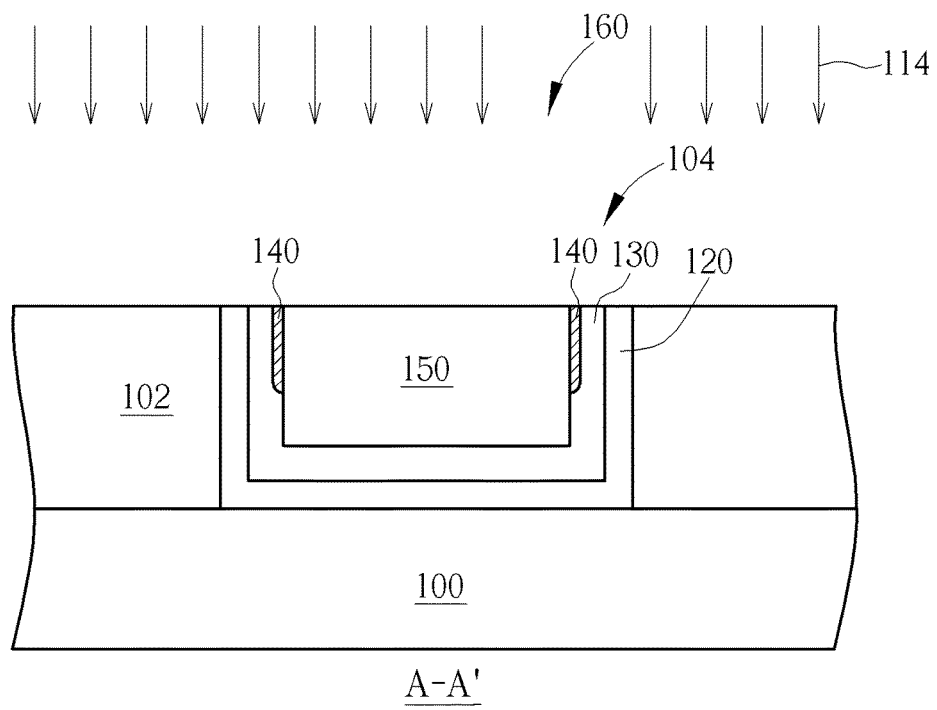

Please refer to FIG. 5. After the planarization process 112, an etching back process 114 is performed to remove a portion of the metal layer 150, a portion of the high resistive layer 140, a portion of the nucleation layer 130, and a portion of the barrier layer 120. The etching back process 114 preferably includes an etchant with low selection ratio, and thus the portion of the metal layer 150, the portion of the high resistive layer 140, the portion of the nucleation layer 130 and the portion of the barrier layer 120 above the opening of the trench 104 are equally removed. Consequently, the dielectric layer 102 is exposed and a conductive structure 160 is formed, as shown in FIG. 5. Since the portion of the metal layer 150, the portion of the high resistive layer 140, the portion of the nucleation layer 130 and the portion of the barrier layer 120 above the opening of the trench 104 are removed by the etching back process 114 instead of the planarization process 112, dishing defects that are often found in the planarization process 112 are avoided.

Figure 6:
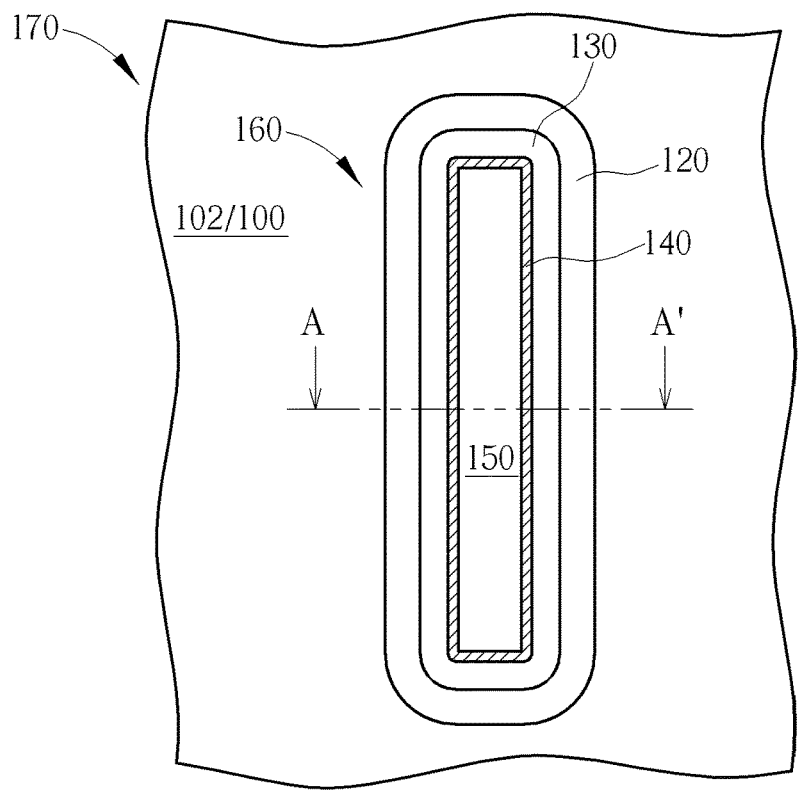
FIG. 6 is a schematic drawing illustrating a layout structure including the conductive structure.

Please refer to FIG. 5 and FIG. 6, FIG. 5 is a schematic drawing illustrating a conductive structure formed by the method for forming the conductive structure provided by the abovementioned first preferred embodiment, FIG. 6 is a schematic drawing illustrating a layout structure including the conductive structure, and FIG. 5 is a cross-sectional view taken along a Line A-A' of FIG. 6. As shown in FIG. 5, the conductive structure 160 provided by the preferred embodiment includes the substrate 100 including the dielectric layer 102 formed thereon, the trench 104 formed in the dielectric layer 102, the barrier layer 120 formed in the trench 104, the nucleation layer 130 formed on the barrier layer 120, the metal layer 150 formed on the nucleation layer 130, and the high resistive layer 140 sandwiched in between a portion of the barrier layer 120 and a portion of the metal layer 150. Furthermore, as shown in FIG. 5, the high resistive layer 140 is sandwiched in between the nucleation layer 130 and the metal layer 150, and more particularly, the high resistive layer 140 is sandwiched in between a portion of the nucleation layer 130 near the opening of the trench 104 and a portion of the metal layer 150 near the opening of the trench 104. Therefore, a bottom of the metal layer 150 contacts the nucleation layer 130. As mentioned above, the metal layer 150 includes a metal material, and the high resistive layer 140 includes a metal nitride, a metal oxide, and a metal carbide of the metal material, such as WN, WO or WC.

As shown in FIG. 6, according to the preferred embodiment, the layout structure 170 including the conductive structure 160 includes the dielectric layer 102 formed on the substrate 100 and the conductive structure 160 formed in the dielectric layer 102. And the conductive structure 160 further includes the barrier layer 120, the metal layer 150 formed within the barrier layer 120, the high resistive layer 140 sandwiched in between the barrier layer 120 and the metal layer 150, and the nucleation layer 130 sandwiched in between the high resistive layer 140 and the barrier layer 120. Furthermore, the barrier layer 120, the nucleation layer 130 and the high resistive layer 140 form a concentric pattern as shown in FIG. 6.

According to the method for manufacturing the conductive structure provided by the first preferred embodiment, the high resistive layer 140 is formed to protect the barrier layer 120, and thus the barrier layer 120 is not exposed in the planarization process 114. In other words, the high resistive layer 140 serves as a protecting layer for the underneath layer(s) such as the nucleation layer 130 and the barrier layer 120. Therefore dishing defects are avoided. Accordingly, the high resistive layer 130 is sandwiched in between the metal layer 150 and the nucleation layer 130 in the conductive structure 160 and the layout structure 170 including the conductive structure 160.

Figure 7:
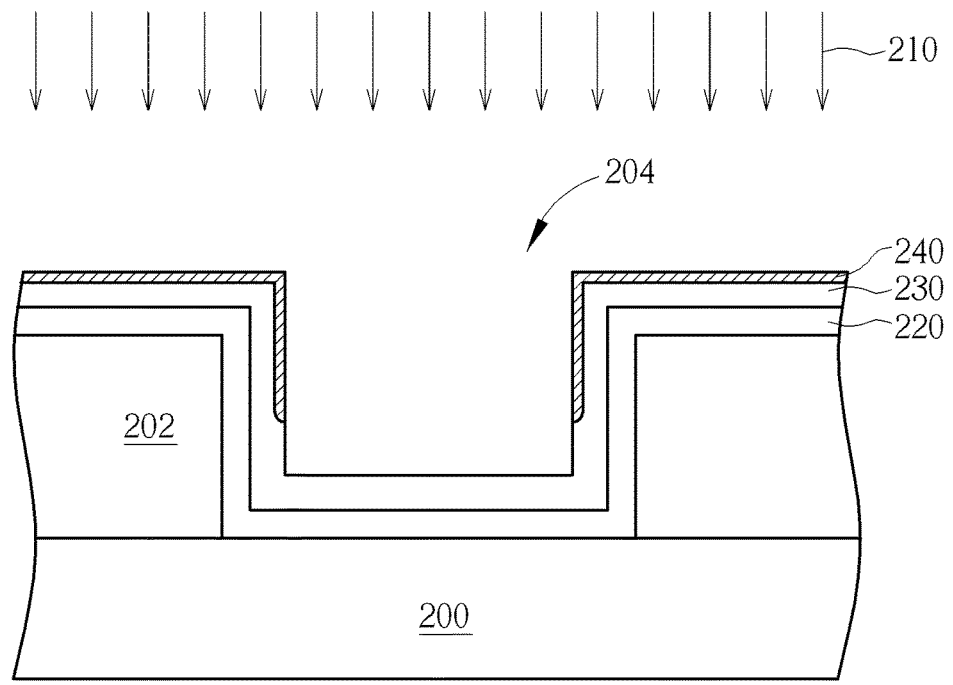
Figure 8:
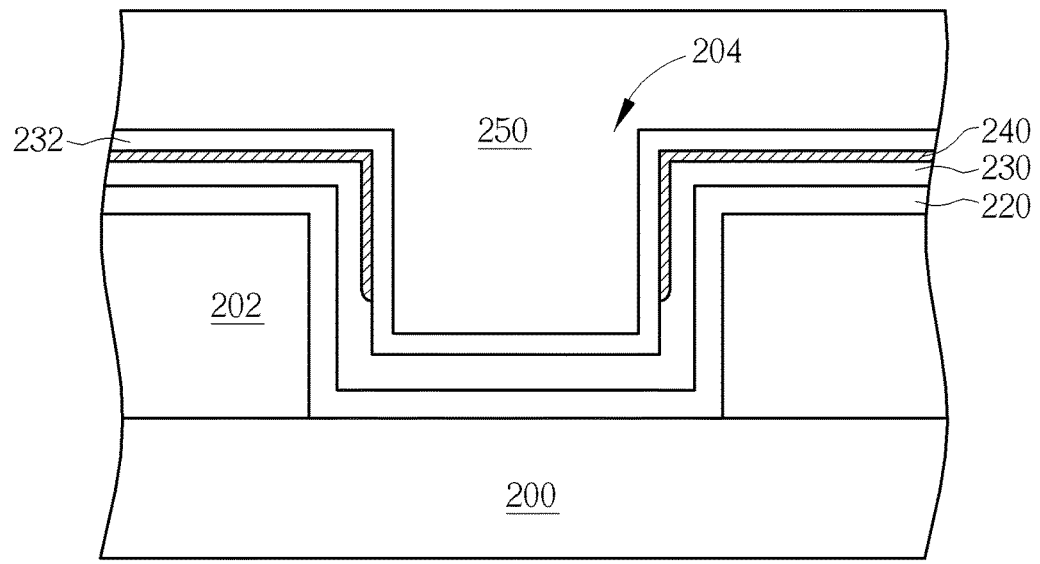
Figure 9:
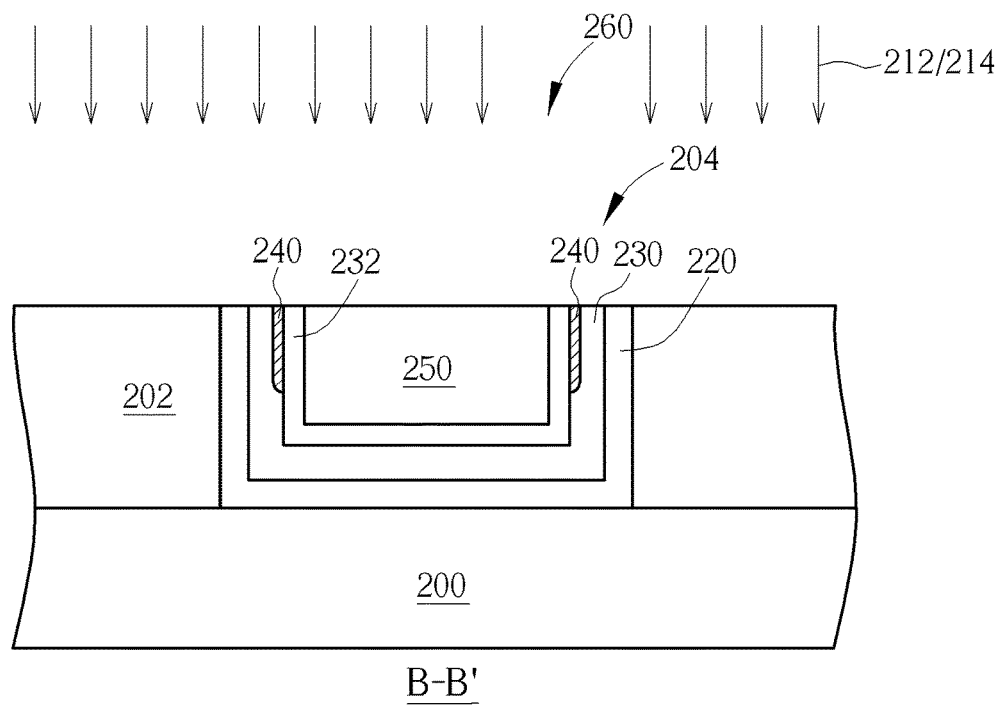

Please refer to FIGS. 7-9, which are schematic drawings illustrating a method for manufacturing a conductive structure provided by a second preferred embodiment of the present invention. It should be noted that elements the same in both of the first and second preferred embodiments can include the same material, and thus those details are omitted herein in the interest of brevity. As shown in FIG. 7, the method for manufacturing the conductive structure provided by the preferred embodiment first provides a substrate 200, and an active circuit (not shown) is disposed in the substrate 200. It should be easily understood to those skilled in the art that the active circuit may include a plurality of MOS transistor devices (not shown) or other devices. And a plurality of STIs (not shown) can be provided to isolate those devices. A dielectric layer 202 is formed on the substrate 200. In some embodiments of the present invention, the dielectric layer 202 can be an ILD layer. In other embodiments of the present invention, the dielectric layer 202 can be an IMD layer. At least a trench 204 is formed in the dielectric layer 202. Next, a barrier layer 220 and a nucleation layer 230 are sequentially formed in the trench 204 and on the substrate 200. In the preferred embodiment, the barrier layer 220 can include a TiN layer, but not limited to this. It is well-known to those skilled in the art that the nucleation layer is a conformal thin metal layer that serves as a base to forma thicker metal layer including the same metal material. For example, when a tungsten layer is to be formed, the nucleation layer 230 can be a thin tungsten layer. And when a copper layer is to be formed, the nucleation layer 230 can be a thin copper layer. Additionally, a thickness of the nucleation layer 230 can be 70 Å, but not limited to this.

Please still refer to FIG. 7. After forming the nucleation layer 230, a surface treatment 210 is performed to a surface of the nucleation layer 230. Consequently, a high resistive layer 240 is formed on the surface of the nucleation layer 230. A thickness of the high resistive layer 240 can be 1%-10% of the thickness of the nucleation layer 230, but not limited to this. In the preferred embodiment, the surface treatment 210 includes introducing nitrogen, oxygen, or carbon, but not limited to this. Consequently, nitridation, oxidation or carbonization occurs on the surface of the nucleation layer 230 and thus the high resistive layer 240 is formed. It is noteworthy that the nitridation, oxidation or carbonization occurs on a portion of the surface of the nucleation layer 230. In detail, the nitridation, oxidation or carbonization occurs on the portion of the surface above an opening of the trench 204. Specifically, a reaction rate on the surface above the opening of the trench 204 is much larger than a reaction rate on a surface of the nucleation layer 230 within the trench 204. Therefore, by adjusting parameters of the surface treatment 210, the nitridation, oxidation or carbonization can be stopped when the high resistive layer 240 is formed on the surface of the nucleation layer 230 above or around the opening of the trench 204. In other words, in some embodiments of the present invention, the nucleation layer 230 preferably is still exposed at a bottom of the trench 204 as shown in FIG. 7. However, in a modification to the preferred embodiment, a duration of the surface treatment 210 can be extended till the entire surface of the nucleation layer 230 is reacted and thus the high resistive layer 240 is formed on the nucleation layer 230 entirely. As mentioned above, since the high resistive layer 240 is formed by the nitridation, oxidation, or carbonization of at least a portion the surface of the nucleation layer 230, which includes a metal material the same with a metal layer to be subsequently formed thereon, the high resistive layer 240 includes a metal nitride, a metal oxide, or metal carbide of that metal material. For example, when the metal layer to be formed includes tungsten, the high resistive layer 240 includes WN, WO, or WC.

Please refer to FIG. 8. According to the preferred embodiment, a nucleation layer 232 is formed on the high resistive layer 240/the nucleation layer 230 after the surface treatment 210. And a material and a thickness of the nucleation layer 232 can be the same with those of the nucleation layer 230, but not limited to this. After forming the nucleation layer 232, a metal layer 250 is formed on the substrate 200 to fill up the trench 204. It is noteworthy that the metal layer 250 is nucleated and formed from a surface of the nucleation layer 232. Since the nucleation layer 232 entirely covers the heterogeneous surface of the high resistive layer 240 and the nucleation layer 230, the metal layer 250 can be formed from the homogeneous surface of the nucleation layer 232. As mentioned above, the metal layer 250 includes a metal material the same with the nucleation layer 230/232 that is tungsten in the preferred embodiment, but not limited to this.

Please refer to FIG. 9. After forming the metal layer 250, a planarization process 212 such as a CMP process is performed to remove a portion of the metal layer 250 and a portion of the nucleation layer 232 to expose the high resistive layer 240. As mentioned above, the barrier layer 220 is shielded by the high resistive layer 240, and thus no eddy current will be created or detected in the planarization process 212. And the planarization process 212 can be terminated by adjusting parameters such as duration. In other words, the high resistive layer 240 and the nucleation layer 230 serve as a protecting layer for the barrier layer 220, as shown in FIG. 9. In other embodiments of the present invention, since the high resistive layer 240 is to shield the barrier layer 220, removal of the high resistive layer 240 can be recognized once eddy currents are detected. Accordingly, the planarization process 212 is immediately terminated, and at least the nucleation layer 230 still serves as a protecting layer for the barrier layer 220.

Please still refer to FIG. 9. After the planarization process 212, an etching back process 214 is performed to remove a portion of the metal layer 250, a portion of the nucleation layer 232, a portion of the high resistive layer 240, a portion of the nucleation layer 230, and a portion of the barrier layer 220. Specifically, the etching back process 214 equally removes the portion of the metal layer 250, the portion of the nucleation layer 232, the portion of the high resistive layer 240, the portion of the nucleation layer 230, and the portion of the barrier layer 220 above the opening of the trench 204. Consequently, the dielectric layer 202 is exposed and a conductive structure 260 is formed, as shown in FIG. 9. Since the portion of the metal layer 250, the portion of the nucleation layer 232, the portion of the high resistive layer 240, the portion of the nucleation layer 230, and the portion of the barrier layer 220 above the opening of the trench 204 are removed by the etching back process 214 instead of the planarization process 212, dishing defects that are often found in the planarization process 212 are avoided.

Figure 10:
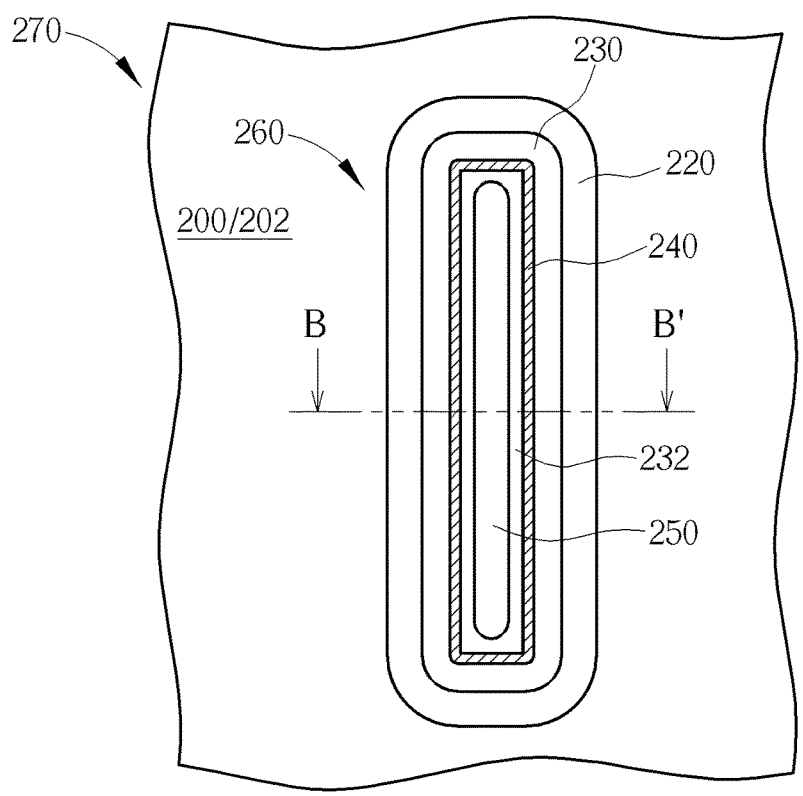
FIG. 10 is a schematic drawing illustrating a layout structure including the conductive structure.

Please refer to FIG. 9 and FIG. 10, FIG. 9 is a schematic drawing illustrating a conductive structure formed by the method for forming the conductive structure provided by the abovementioned second preferred embodiment, FIG. 10 is a schematic drawing illustrating a layout structure including the conductive structure, and FIG. 9 is a cross-sectional view taken along a Line B-B' of FIG. 10. As shown in FIG. 9, the conductive structure 260 provided by the preferred embodiment includes the substrate 200 including the dielectric layer 202 formed thereon, the trench 204 formed in the dielectric layer 202, the barrier layer 220 formed in the trench 204, the nucleation layer 230 formed on the barrier layer 220, the metal layer 250 formed on the nucleation layer 230, and the high resistive layer 240 sandwiched in between a portion of the barrier layer 220 and a portion of the metal layer 250. As shown in FIG. 9, the high resistive layer 240 is sandwiched in between a portion of the nucleation layer 230 and a portion of the metal layer 250. Furthermore, another nucleation layer 232 is sandwiched in between the high resistive layer 240 and a portion of the metal layer 250. In other words, the high resistive layer 240 is sandwiched in between two nucleation layers 230/232 near the opening of the trench 204. Therefore, sidewalls and a bottom of the metal layer 250 contact the nucleation layer 232 as shown in FIG. 9. As mentioned above, the metal layer 250 includes a metal material, and the high resistive layer 240 includes a metal nitride, a metal oxide, and a metal carbide of the metal material, such as WN, WO or WC.

As shown in FIG. 10, according to the preferred embodiment, the layout structure 270 including the conductive structure 260 includes the dielectric layer 202 formed on the substrate 200 and the conductive structure 260 formed in the dielectric layer 202. And the conductive structure 260 further includes the barrier layer 220, the metal layer 250 formed within the barrier layer 220, the high resistive layer 240 sandwiched in between the barrier layer 220 and the metal layer 250, the nucleation layer 230 sandwiched in between the high resistive layer 240 and the barrier layer 220, and the nucleation layer 232 sandwiched in between the high resistive layer 240 and the metal layer 250. Furthermore, the barrier layer 220, the nucleation layer 230, the high resistive layer 240 and the nucleation layer 232 form a concentric pattern as shown in FIG. 10.

According to the method for manufacturing the conductive structure provided by the second preferred embodiment, the high resistive layer 240 is formed to protect the barrier layer 220, and thus the barrier layer 220 is not exposed in the planarization process 214. In other words, the high resistive layer 240 serves as a protecting layer for the underneath layer(s) such as the nucleation layer 230 and the barrier layer 220. Therefore dishing defects are avoided. Furthermore, another nucleation layer 232 is formed on the high resistive layer 240 according to the preferred embodiment, such that formation of the metal layer 250 can be improved. Accordingly, the high resistive layer 240 is sandwiched in between the two nucleation layers 230/232 in the conductive structure 260 and the layout structure 270 including the conductive structure 260.

Figure 11:
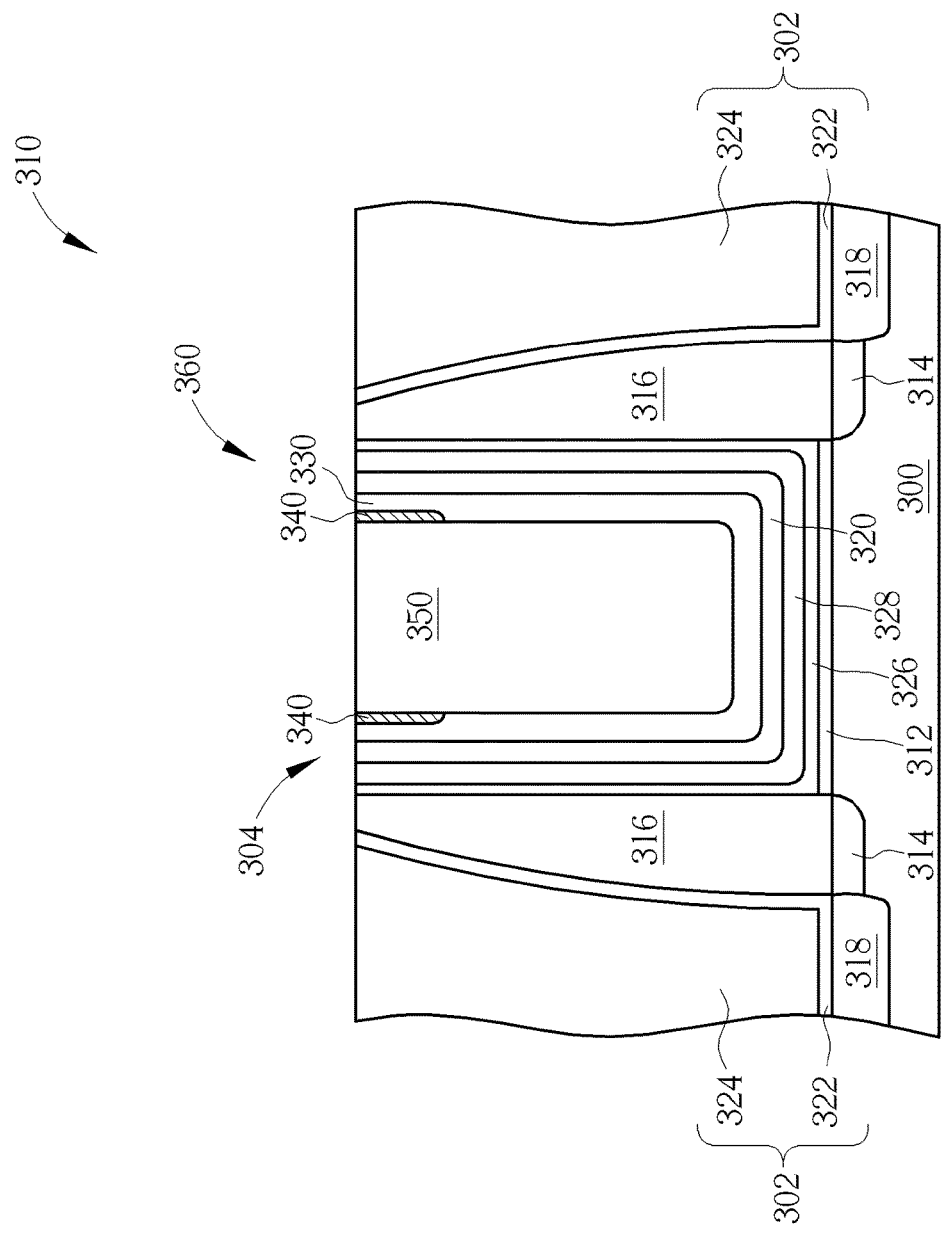
FIG. 11 is a schematic drawing illustrating a conductive structure provided by a preferred embodiment of the present invention.

Please refer to FIG. 11, which is a schematic drawing illustrating a conductive structure provided by a preferred embodiment of the present invention. It should be easily understood that the conductive structure can be formed by the method for manufacturing he conductive structure provided by the aforementioned first or second preferred embodiment, therefore those steps are omitted for simplicity. As mentioned above, the conductive structure provided by the present invention can be embodied on a substrate including active circuits formed therein, and the active circuit may include a plurality of transistor devices (not shown) or other devices. According to the preferred embodiment, a substrate 300 including at least a transistor device 310 is provided. As shown in FIG. 11, the transistor device 310 can include a dielectric layer 312, a dummy gate or a replacement gate such as a polysilicon layer or an amorphous silicon layer (not shown), and a patterned hard mask (not shown). The transistor device 310 can include lightly-doped drains (LDDs) 314 formed in the substrate 300, a spacer 316 formed on sidewalls of the dummy gate, and a source/drain region 318 formed in the substrate 300. The spacer 316 can be a multi-layered structure, but not limited to this. Furthermore, selective strain scheme (SSS) can be used in the preferred embodiment. For example, a selective epitaxial growth (SEG) method can be used to form the source/drain region 318. When the transistor devices 310 is an n-typed transistor device, epitaxial silicon layers of SiC or SiP are used to form the source/drain region 318. When the transistor device 310 is a p-typed transistor device, epitaxial silicon layers of SiGe are used to form the source/drain region 318. Additionally, salicides (not shown) can be formed on the source/drain region 318. After forming the transistor device 310, an etch liner such as a contact etch stop layer (hereinafter abbreviated as CESL) 322 is selectively formed on the substrate 300, and an ILD layer 324 is subsequently formed. As shown in FIG. 11, the CESL 322 and the ILD layer 324 construct a dielectric layer 302, and the transistor device 310 is embedded in the dielectric layer 302.

Please still refer to FIG. 11. Next, a planarization process such as a CMP process is performed to planarize the ILD layer 324 and the CESL 322. Furthermore, the planarization process is performed to remove the patterned hard mask, such that the dummy gate is exposed. The dummy gate is then removed to form a trench 304. In other words, location and size of the trench 304 are defined by the spacer 316 in the dielectric layer 302. Thereafter, a high-k gate dielectric layer 326 and a work function metal layer 328 are formed in the trench 304. It is therefore understood that the preferred embodiment is to integrate the high-k last approach, but not limited to this. In the high-k last approach, the dielectric layer 312 originally formed under a bottom of the dummy gate serves as an interfacial layer (IL), and the interfacial layer provides a superior interface between the substrate 300 and the high-k gate dielectric layer 326. However, in a modification to the preferred embodiment, it can be integrated with high-k first approach. And in the high-k first approach, the dielectric layer 312 can include high-k material, but not limited to this. In some embodiment of the present invention, when the transistor device 310 is the p-typed transistor, the work function metal layer 328 is a p-typed work function metal layer including any suitable metal material having a work function between about 4.8 eV and about 5.2 eV. Alternatively, in other embodiments of the present invention, when the transistor device 310 is the n-typed transistor, the work function metal layer 328 is an n-typed work function metal layer including any suitable metal materials having a work function between about 3.9 eV and about 4.3 eV. In addition, the work function metal layer 328 can be a single-layered structure or a multi-layered structure. Furthermore, metal layers such as a bottom barrier layer (not shown) and/or an etch stop layer (not shown) can be formed between the work function metal layer 328 and the high-k gate dielectric layer 326 if required.

Please still refer to FIG. 11. After forming the work function metal layer 328, the method for manufacturing the conductive structure provided by the aforementioned first preferred embodiment is performed. Accordingly, the conductive structure 360 can be a metal gate in the preferred embodiment. And the conductive structure/metal gate 360 includes at least the high-k gate dielectric layer 326, the work function metal layer 328, a barrier layer 320, a nucleation layer 330, a metal layer 350, and a high resistive layer 340 sandwiched in between a portion of the metal layer 350 and a portion of the nucleation layer 330. As shown in FIG. 11, the high-k gate dielectric layer 326 and the work function metal layer 328 are sandwiched in between the barrier layer 320 and the substrate 300. In another embodiment of the present invention, the method for manufacturing the conductive structure provided by the aforementioned second preferred embodiment is performed. Accordingly, another nucleation layer (not shown) is sandwiched in between the metal layer 350 and the high resistive layer 340 in the conductive structure 360.

Figure 12:
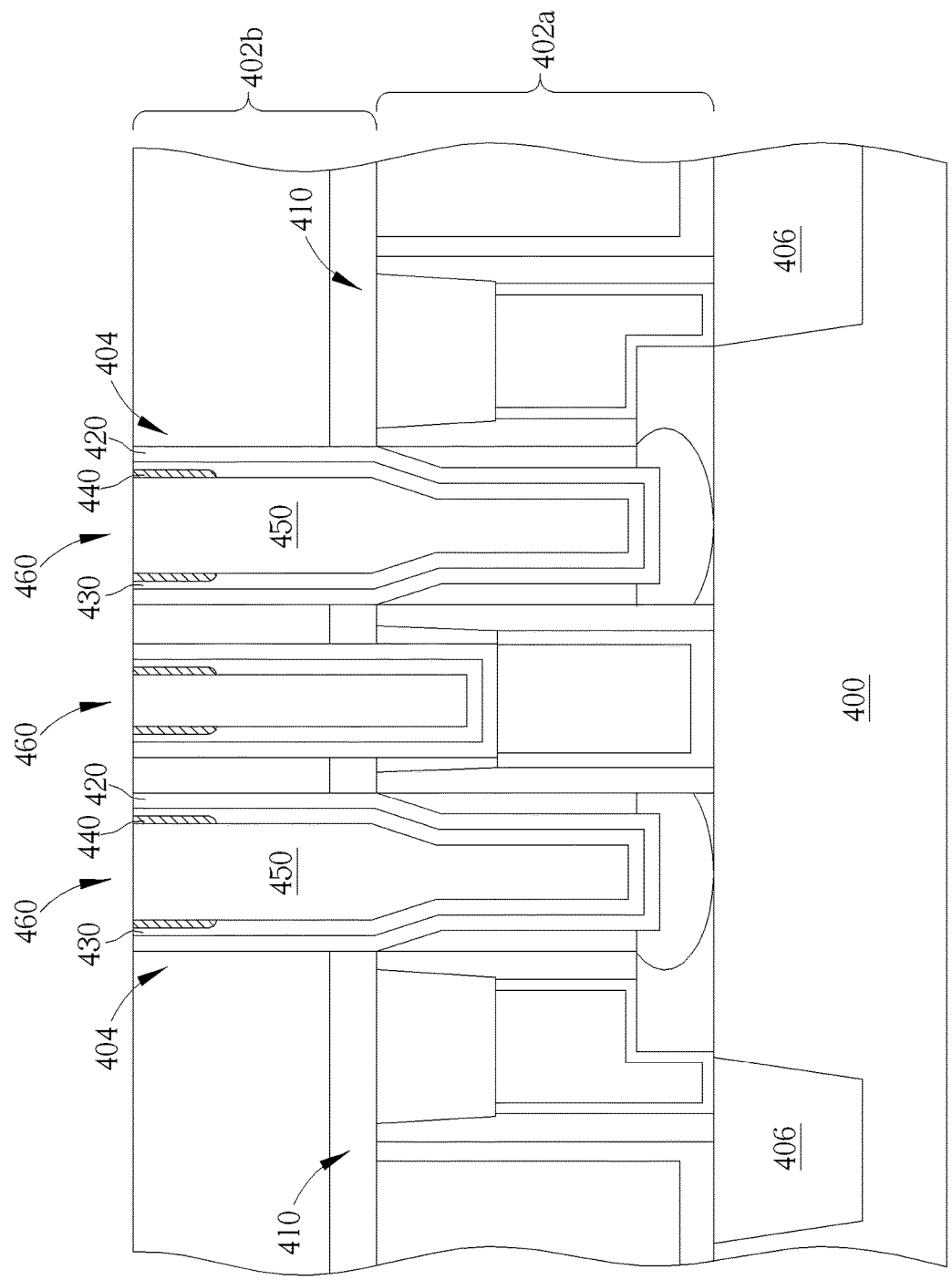
FIG. 12 is a schematic drawing illustrating a conductive structure provided by another preferred embodiment of the present invention.

Please refer to FIG. 12, which is a schematic drawing illustrating a conductive structure provided by another preferred embodiment of the present invention. It should be easily understood that the conductive structure can be formed by the method for manufacturing the conductive structure provided by the aforementioned first or second preferred embodiment, therefore those steps are omitted for simplicity. As mentioned above, the conductive structure provided by the present invention can be embodied on a substrate 400 including active circuits formed therein, and the active circuit may include a plurality of transistor devices 410 or other devices. And a plurality of STIs 406 can be formed in the substrate 400 to isolate those devices. In the preferred embodiment the transistor device 410 can be a transistor device including a metal gate, and the metal gate can be the conductive structure 360 as mentioned above. As shown in FIG. 12, the transistor device 410 is formed on the substrate 400 and embedded in a dielectric layer 402a. It is noteworthy that the preferred embodiment further provides a dielectric layer 402b formed on the transistor device 410 and the dielectric layer 402a.

Next, at least a trench 404 is formed in both of the dielectric layer 402a and the dielectric layer 402b. Thereafter, the method for manufacturing the conductive structure provided by the aforementioned first preferred embodiment is performed. Accordingly, a conductive structure 460 is formed in the trench 404. The conductive structure 460 serves as a contact plug and a zeroth via structure V0 of an interconnection and provide electrical connections between the transistor devices 410 and other devices. The conductive structure 460 includes a barrier layer 420, a nucleation layer 430 formed on the barrier layer 420, a metal layer 450 formed on the nucleation layer 430, and a high resistive layer 440 sandwiched in between a portion of the nucleation layer 430 and a portion of the metal layer 450. In other embodiments of the present invention, the method for manufacturing the conductive structure provided by the aforementioned second preferred embodiment is performed. Accordingly, another nucleation layer (not shown) is sandwiched in between the metal layer 450 and the high resistive layer 440 in the conductive structure 460. It is noteworthy that a top surface of the metal layer 450, a top surface of the high resistive layer 440, a top surface of the nucleation layer 430, and a top surface of the barrier layer 420 of the conductive structure 460 are coplanar with a top surface of the dielectric layer 402b, as shown in FIG. 12.

Figure 13:
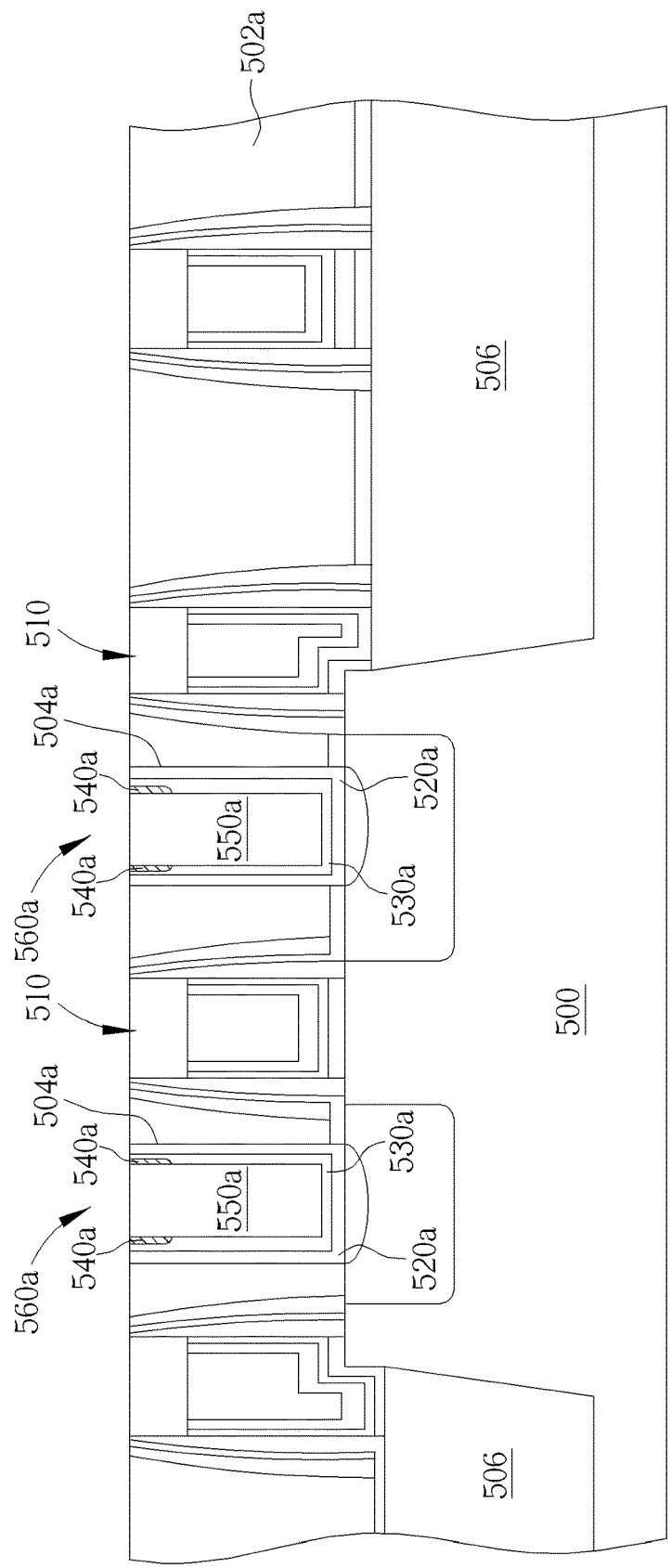
Figure 14:
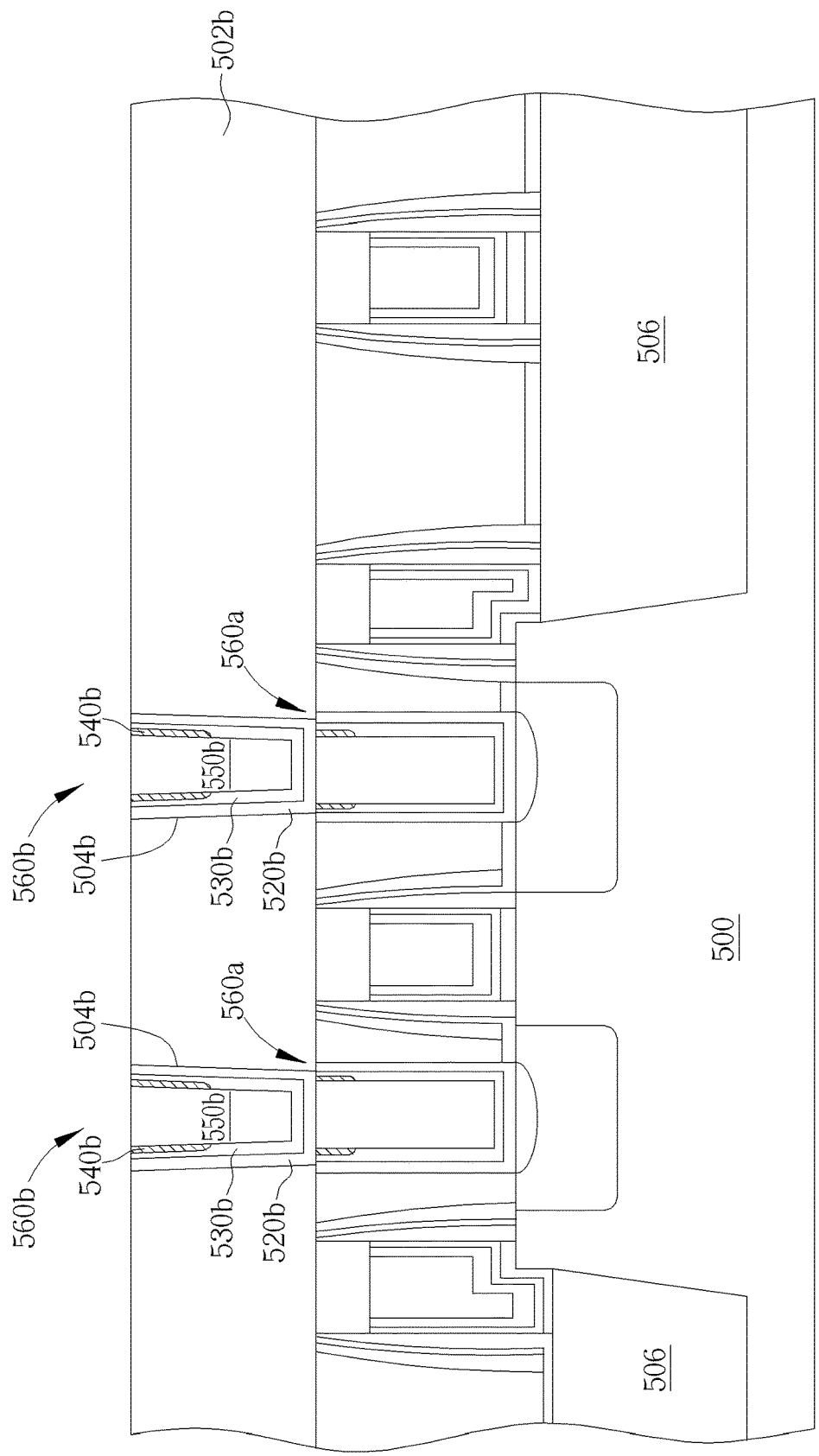

Please refer to FIGS. 13-14, which are schematic drawings illustrating a conductive structure provided by still another preferred embodiment of the present invention. It should be easily understood that the conductive structure can be formed by the method for manufacturing the conductive structure provided by the aforementioned first or second preferred embodiment, therefore those steps are omitted for simplicity. As mentioned above, the conductive structure provided by the present invention can be embodied on a substrate 500 including active circuits formed therein, and the active circuits may include a plurality of transistor devices 510 or other devices. And a plurality of STIs 506 can be formed in the substrate 500 to isolate those devices. In the preferred embodiment the transistor device 510 can be a transistor device including a metal gate, and the metal gate can be the conductive structure 360 as mentioned above. As shown in FIG. 13, the transistor device 510 is formed on the substrate 500 and embedded in a dielectric layer 502a.

Please refer to FIG. 13. Next, at least a trench 504a is formed in the dielectric layer 502a. Thereafter, the method for manufacturing the conductive structure provided by the aforementioned first preferred embodiment is performed. Accordingly, a conductive structure 560a is formed in the trench 504a. The conductive structure 560a serves as a contact plug and a zeroth via structure V0 of an interconnection and provides electrical connection between the transistor devices 510 and other devices. The conductive structure 560a includes a barrier layer 520a, a nucleation layer 530a formed on the barrier layer 520a, a metal layer 550a formed on the nucleation layer 530a, and a high resistive layer 540a sandwiched in between a portion of the nucleation layer 530a and a portion of the metal layer 550a. In another embodiment of the present invention, the method for manufacturing the conductive structure provided by the aforementioned second preferred embodiment is performed. Accordingly, another nucleation layer (not shown) is sandwiched in between the metal layer 550a and the high resistive layer 540a in the conductive structure 560a. It is noteworthy that in the preferred embodiment, the trench 504a is formed in the dielectric layer 502a, therefore a top surface of the metal layer 550a, a top surface of the high resistive layer 540a, a top surface of the nucleation layer 530a, and a top surface of the barrier layer 520a of the conductive structure 560a are coplanar with a top surface of the dielectric layer 502a, as shown in FIG. 13.

Please refer to FIG. 14. After forming the conductive structure 560a, a dielectric layer 502b is formed on the substrate 500, and more particularly, on the transistor device 510, the conductive structure 560a, and the dielectric layer 502a. Next, at least a trench 504b is formed in the dielectric layer 502b. Thereafter, the method for manufacturing the conductive structure provided by the aforementioned first preferred embodiment is performed. Accordingly, a conductive structure 560b is formed in the trench 504b. The conductive structure 560b serves as a zeroth via structure V0 of the interconnection and provides electrical connection between the transistor devices 510 and other devices. The conductive structure 560b includes a barrier layer 520b, a nucleation layer 530b formed on the barrier layer 520b, a metal layer 550b formed on the nucleation layer 530b, and a high resistive layer 540b sandwiched in between a portion of the nucleation layer 530b and a portion of the metal layer 550b. In another embodiment of the present invention, the method for manufacturing the conductive structure provided by the aforementioned second preferred embodiment is performed. Accordingly, another nucleation layer (not shown) is sandwiched in between the metal layer 550b and the high resistive layer 540b in the conductive structure 560b. It is noteworthy that in the preferred embodiment, the trench 504b is formed in the dielectric layer 502b, therefore a top surface of the metal layer 550b, a top surface of the high resistive layer 540b, a top surface of the nucleation layer 530b, and a top surface of the barrier layer 520b of the conductive structure 560b are coplanar with a top surface of the dielectric layer 502b, as shown in FIG. 14.

According to the aforementioned preferred embodiments, it is concluded that the method for manufacturing the conductive structure can be used to form not only the metal gate and the contact plug but also the interconnection, since the interconnection can be formed by steps of forming a dielectric layer, forming trenches in the dielectric layer, sequentially forming a barrier layer and a nucleation layer in the trench, performing a surface treatment to the nucleation layer to form a high resistive layer, (forming another nucleation layer), filling the trench with a metal layer, performing a planarization process, and performing an etching back process layer. And these abovementioned steps can be repeated any number of times to form the stacked structure of the interconnection. It is therefore concluded that the method for manufacturing the conductive structure provided by the present invention is able to form the metal gates, the contact plugs, and the interconnections metals (including the wirings and the via structures). In other words, the method for manufacturing the conductive structure provided by the present invention can be integrated into both the front-end-of-line (FEOL) process and the back-end-of-line (BEOL) process.

According to the method for manufacturing the conductive structure provided by the present invention, the high resistive layer is formed on the surface of the nucleation layer by performing the surface treatment, and the high resistive layer is to protect the underneath layers such as the nucleation layer and the barrier layer during planarization process. Consequently, dishing defect is avoided. Accordingly, the conductive structure and the layout structure including the conductive structure obtained by the method include the high resistive layer sandwiched in between the metal layer and the nucleation layer. Furthermore, in the layout structure including the conductive structure, the high resistive layer, the nucleation layer and the barrier layer include a concentric pattern. Furthermore, the method for manufacturing the conductive structure provided by the present invention can be integrated into both the FEOL process and the BEOL process, therefore the process flexibility integration are further improved according to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout structure comprising a conductive structure comprising:
   a dielectric layer formed on a substrate; and
   the conductive structure formed in the dielectric layer, the conductive structure further comprising:
      a barrier layer;
      a metal layer formed within the barrier layer;
      a first nucleation layer sandwiched in between the barrier layer and the metal layer; and
      a high resistive layer sandwiched in between the first nucleation layer and the metal layer.

2. The layout structure comprising the conductive structure according to claim 1, wherein the barrier layer, the first nucleation layer and the high resistive layer concentrically surrounding the metal layer.

3. The layout structure comprising the conductive structure according to claim 1, further comprising a second nucleation layer sandwiched in between the high resistive layer and the metal layer.

4. The layout structure comprising the conductive structure according to claim 3, wherein the barrier layer, the first nucleation layer, the high resistive layer and the second nucleation layer concentrically surrounding the metal layer.

5. The layout structure comprising the conductive structure according to claim 1, wherein the metal layer comprises a metal material, and the high resistive layer comprises a metal nitride, a metal oxide, or a metal carbide of the metal material of the metal layer.

6. The layout structure comprising the conductive structure according to claim 5, wherein the metal material of the metal layer comprises tungsten (W), and the high resistive layer comprises tungsten nitride (WN), tungsten oxide (WO), or tungsten carbide (WC).

7. The layout structure comprising the conductive structure according to claim 1, further comprising a spacer sandwiched in between the dielectric layer and the barrier layer.

8. The layout structure comprising the conductive structure according to claim 5, further comprising at least a high-k gate dielectric layer and a work function metal layer sandwiched in between the spacer and the barrier layer.

* * * * *